United States Patent [19]
Wu

[11] Patent Number: 4,890,153
[45] Date of Patent: Dec. 26, 1989

[54] SINGLE BONDING SHELF, MULTI-ROW WIRE-BOND FINGER LAYOUT FOR INTEGRATED CIRCUIT PACKAGE

[75] Inventor: Ching-An Wu, San Jose, Calif.

[73] Assignee: Fairchild Semiconductor Corporation, Cupertino, Calif.

[21] Appl. No.: 848,302

[22] Filed: Apr. 4, 1986

[51] Int. Cl.[4] ............................................. H04N 9/16
[52] U.S. Cl. ...................... 357/74; 361/394; 361/401; 361/414; 174/52.4
[58] Field of Search ................. 357/74; 361/394, 401, 361/414; 174/52 P Primary Examiner—Robert S. Macon
Attorney, Agent, or Firm—Lee Patch; Clifton L. Anderson

[57] ABSTRACT

An integrated circuit assembly (10) includes a bipolar VLSI die (12) contained in a multilayer ceramic pin-grid array package (14). A bonding shelf (18) defined on a single ceramic layer contains an inner row (20) of bonding pads (26) and an outer row (22) of bonding pads (28). Bonding wires (30, 32) extend from bonding pads (34) on the die to the opposing pads on the inner and outer rows to provide an electrical interface between the die and the package. The inner and outer bonding pads are connected by metallized fingers to conductive pads (61, 65) which provide a power and signal interface with an incorporating system.

The inner pads include metallized vias (24) to metallized segments on a layer other than that on which the bonding shelf is defined. Thus, the metallized fingers including the inner row of pads can extend to the pins while passing above or below, rather than between, adjacent pads of the outer row. In this way, the pitch of the package bonding pads is effectively doubled without the misalignment, and resulting problems with shorted bonding wires, inherent when the rows are located on separated bonding shelves.

7 Claims, 2 Drawing Sheets

SINGLE BONDING SHELF, MULTI-ROW WIRE-BOND FINGER LAYOUT FOR INTEGRATED CIRCUIT PACKAGE

BACKGROUND OF THE INVENTION

The present invention relates to integrated circuit packaging, and, more particularly, to an integrated circuit package with a novel wire-bond finger layout.

Most very large scale integrated (VLSI) circuits are fabricated on small silicon or other crystalline substrates. Sophisticated packaging is required to provide electrical interfacing with and protection for these devices. The demands on the integrated circuit package are increased as the required number of input/output and power connections reaches into the hundreds.

The multilayer ceramic pin-grid array (PGA) is recognized as a most suitable technology for ultradense pin layouts. Conductive paths are formed by screen printing metallization patterns on unfired alumina tape or "green sheets". Interlayer connections are made through via holes which are punched out and filled with a paste of conductive material such as aluminum or tungsten. The green sheets are laminated and co-fired to form a monolithic package with complete electrical paths or "fingers" between pin locations and bonding pads located on a ceramic bonding shelf.

A package so constructed generally includes a central cavity in which an integrated circuit silicon die can be attached using a gold-silicon eutectic, other hard or soft solder, a silver glass paste or other bonding material. The die is electrically interfaced to the package using bonding wires which extend between bonding pads on the die to respective bonding pads on the bonding shelf. Typically, it is convenient to arrange both the die bonding pads and the package bonding pads in square rows so that the bonding wires can be positioned straight across the gap between the die and the shelf.

To a point, an increased pin count can be accommodated by decreasing the pitch of the package bonding pads. However, every production technology imposes some minimum practical pitch. For example, a production technology may not permit bonding pads smaller than 5 mils square. Smaller pads may exceed the precision of available automated wire bonding equipment, or impair the reliability of the conductive nature of the bonding pad itself.

Partial solutions to this problem include radially spreading or fanning the wire bonds so that the bonding pads of the package are on a greater pitch than the bonding pads on the die. This can yield an about 20% practical improvement in pin count. Further increases involve using longer bonding wires than is practical or desirable. Also, the fan arrangement requires each wire to be bonded at a different angle.

Another approach uses multiple rows of package bonding pads, each on a separate bonding shelf located on a separate tier level. Each tier level is defined by an area of a ceramic layer protruding beyond an adjacent layer. By stair-stepping the ceramic layers multiple bonding shelves can be formed. For example, two bonding shelves can each be used to define a square row of package bonding pads at the minimum practical pitch, thus, doubling the pin count that can be accommodated with a single bonding shelf. Typically, the rows are staggered to optimize the spacing of the wires from adjacent die bonding pads.

The two bonding shelf approach has disadvantages. One problem is in the coregistration of the multiple rows of bonding pads. If the staggering is inexact, the likelihood of the bare bonding wires contacting and shorting is greatly increased. There are several contributors to such misalignment.

The major source of misalignment is uneven shrinkage during the co-firing of the ceramic package, which can involve heat exposure at 1500° C. for about 48 hours. Shrinkage can amount to 17%–23% of the area of any given layer, and adjacent layers can shrink in different directions. Furthermore, any problem with shrinkage misalignment is exacerbated when intermediate layers are involved. In addition to misalignment due to shrinkage, the screen printing process introduces alignment errors at each layer.

What is needed, then, is a practical and economical approach to increasing the pin count that can be accommodated by a packaging scheme without the problems due to layer misalignment.

SUMMARY OF THE INVENTION

In accordance with the present invention, a package for an integrated circuit includes plural rows of bonding pads on a single bonding shelf defined on a single package layer. These rows include an inner and an outer row, defined by their relative proximity to a central cavity where an integrated circuit die is to be positioned. Conductive vias extend from pad of the inner row to a second layer of the package. This permits fingers to the inner row of pads to traverse the package without interference with the fingers to the outer row of pads.

In a preferred embodiment of the present invention, the via connects with a conductive segment formed on the second layer. This first segment extends to a second via which directly contacts the respective pin. The outer pads are connected to respective pin vias by conductive segments formed on the bonding-shelf layer of the package.

In another embodiment, design restrictions require a more complex finger routing. Fingers extend from the inner pads down first vias to first conductive segments on a second layer, up second vias to second segments on the bonding-shelf layer, and from there to third vias which connect to the respective pins. Fingers from the outer pads extend along short segments on the bonding-shelf layer, along vias to a third layer, and along conductive segments on this third layer to the vias to the pins. Many other arrangements are made possible by the present invention.

The present invention provides the advantages of the multiple bonding shelf approach in that multiple staggered rows permit the effective pitch of the bonding pads to be multiplied by a factor of two or more. However, since all bonding pads are on a single bonding shelf, the problems with misalignment are essentially eliminated. This makes for an economical ultra-high density package with improved reliability.

DESCRIPTION OF THE PREFERRED EMBODIMENTS

Figure 1:
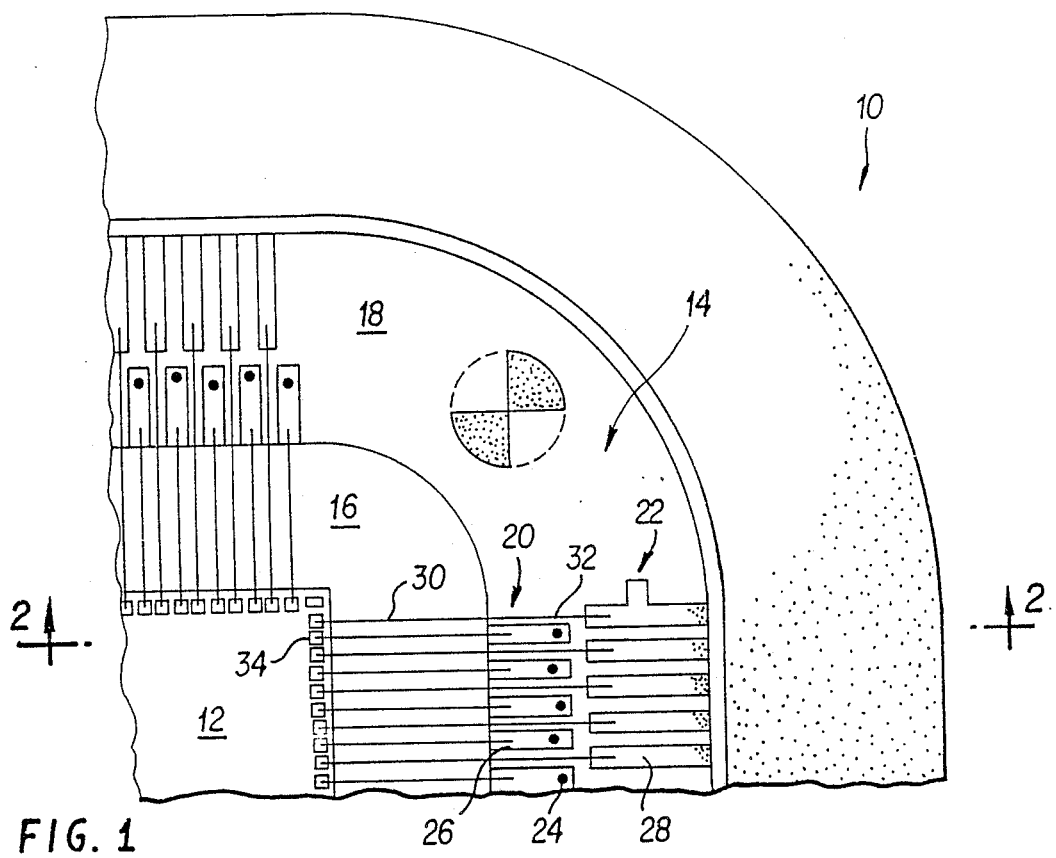
FIG. 1 is a planar view of an integrated circuit assembly in accordance with the present invention.
Figure 2:
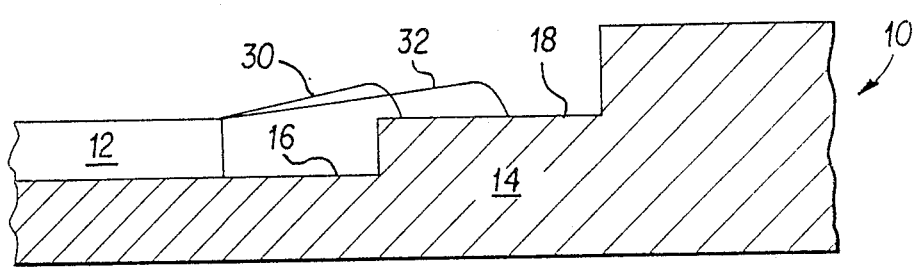
FIG. 2 is a sectional view taken along line 2—2 of FIG. 1.
Figure 3:
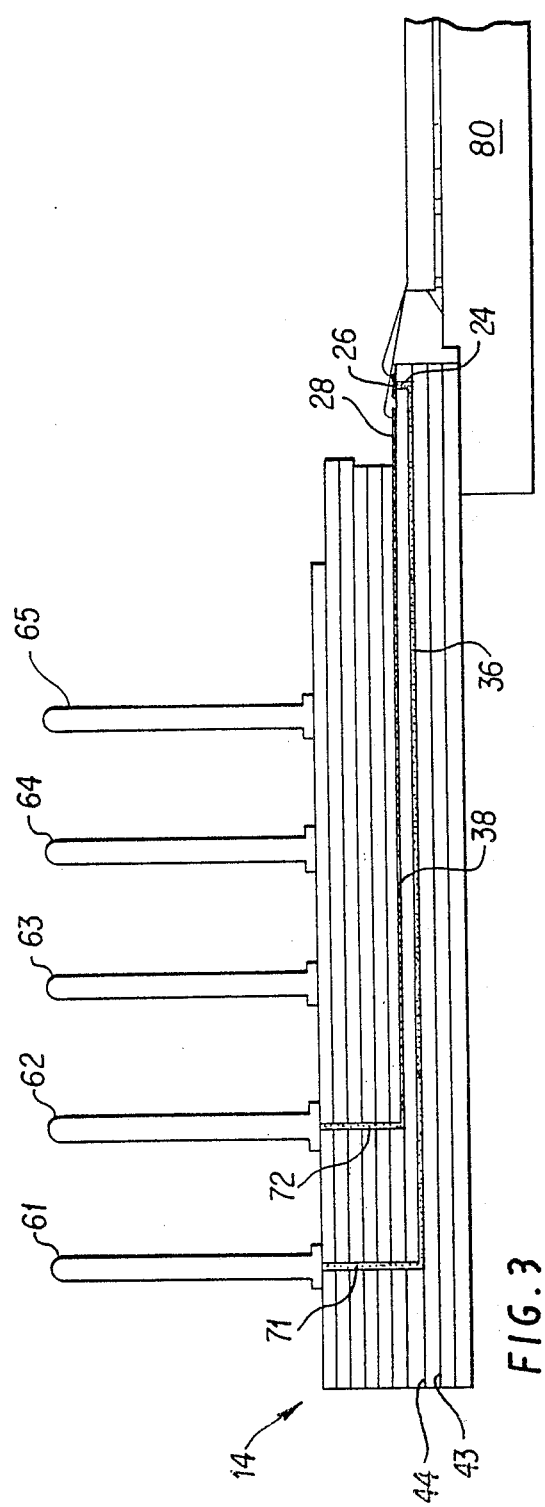
FIG. 3 is a sectional view of a portion of an integrated circuit assembly in accordance with the present invention.

An integrated circuit assembly 10 includes an integrated circuit die 12 and a multilayer circuit package 14, as shown in FIGS. 1, 2 and 3. Die 12 is a very large scale integrated (VLSI) circuit. Package 14 provides protection and electrical interfacing for the die 12, which is situated in a cavity 16 of the package 14.

To provide a very large number of interconnections between die 12 and package 14, a single bonding shelf 18 of package 14 includes an inner row 20 and an outer row 22 of bonding pads. The minimum practical width of the pads is greater than the spacing between pads. Thus, in accordance with the present invention, conductive vias 24 provide an electrical connection of bonding pads 26 of inner row 20 to permit routing below bonding pads 28 of outer row 22.

Preferably, bonding pad rows 20 and 22 are staggered to allow maximal and uniform spacing of the bonding wires 30 and 32. Bonding wires 30 extend from every other die bonding pad 34 to the opposing package bonding pads 26 of inner row 20. Bonding wires 32 extend from the alternate die bonding pads 34 to the respective package bonding pads 28 of outer row 22.

As shown in FIG. 3, package 14 is constituted of several layers, including layers 43 and 44, of insulating ceramic material. Package 14 also includes a large number of conductive pins, including pins 61-65, which provide for physical attachment and electrical interfacing to an incorporating system. Metallized strips or "fingers" include bonding pads 26 and 28 of FIG. 1 and serve as conductive paths to the pins.

The finger to pin 61 includes an inner bonding pad 26, a via 24, conductive segment 36 along layer 43, and a via 71. The finger to pin 62 includes an outer bonding pad 28, a conductive segment 38 along layer 44, and a via 72. Fingers (not illustrated) to the other pins follow this alternating pattern.

Various design constraints can render an alternative embodiment more optimal. Integrated circuit assembly 110, illustrated in FIG. 4, is virtually identical to the embodiment described above except with respect to the conductive paths between the package bonding pads and the pins.

In assembly 110, the conductive finger to pin 162 includes an inner bonding pad 126, via 124, conductive segment 361 along layer 143, via 362 between layers 143 and 144, conductive segment 363 along layer 144 and via 172. The conductive finger to pin 161 includes an outer bonding pad 128, conductive segment 381 along layer 144, via 382 between layer 144 and 146, conductive segment 383 along layer 146, and via 171.

The metallization patterns of assembly 110 reflect the dedication of layer 143 as a ground plane so that only an inner portion is practically available for use by input or output signal fingers. Layers 143, 145, and 147 are ground planes which can be used to shield the signals carried by layers 144 and 146. Thus, each signal carrying layer 144, 146 is shielded above and below by a shielding layer.

Figure 4:
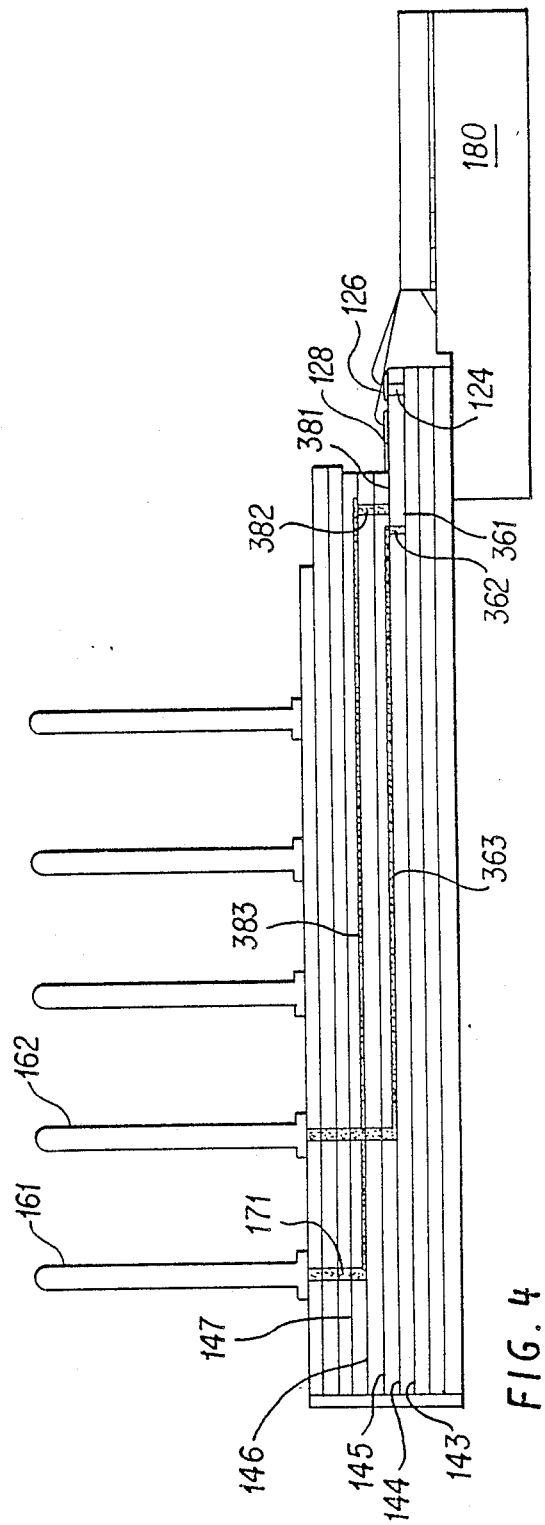
FIG. 4 is a sectional view of a portion of another integrated circuit assembly in accordance with the present invention.

For purposes of completeness, the embodiments illustrated in FIGS. 3 and 4 are shown with heat spreaders 80 and 180, while FIGS. 1 and 2 illustrated an embodiment without such a heat spreader, but with the die attached to a ceramic layer of the package. This is done for heat dissipation purposes and forms no part of the present invention.

The illustrated embodiment includes 260 pins arranged on a 0.100" pitch in a $19 \times 19$ array with an opening in the center for the die and a hermetic seal. The external package size is about 1.96" square. The ten ceramic layers constitute a total thickness of about 0.1". The cavity is about 0.51" square to accommodate the die which is about 0.41" square. These dimensions are specific to the described embodiment, the invention being applicable to wide variations in such dimensions.

As is apparent to those skilled in the art, many variations and modifications of the embodiments described above are provided by the present invention. Therefore, the scope of the present invention is limited only by the following claims.

I claim:

1. A package for an integrated circuit comprising:
   plural layers, said package defining a cavity, a first of said layers defining a bonding shelf adjacent said cavity;
   bonding pads arranged on said bonding shelf in plural rows including an outer row spaced from said cavity and an inner row located between said outer row and said cavity;
   electrical contacts physically connected with said package, said contacts providing for electrical communication with an incorporating system; and
   conductive paths, each path providing an electrical connection between at least one of said contacts and at least one of said bonding pads, said conductive paths including a first conductive path electrically connecting a first of said bonding pads of said inner row with a first of said contacts, said first conductive path including a conductive first segment disposed upon a second of said layers, said first conductive path including a via electrically connecting said first bonding pad with said first segment so that said first conductive path is electrically isolated from all conductive paths of said outer row.

2. The package of claim 1 further characterized in that said first conductive path includes a second segment disposed upon said first layer, said first conductive path including a via electrically connecting said first segment with said second segment.

3. The package of claim 2 further characterized in that said plural layers include a third layer, and in that each conductive path including a pad in said outer row includes a proximal segment disposed on said first layer and a distal segment disposed on said third layer.

4. The package of claim 3 further characterized in that each conductive path including a pad in said outer row includes a via electrically connecting the respective proximal segment with the respective distal segment.

5. An integrated circuit assembly comprising:
   plural layers, said package defining a cavity, a first of said layers defining a bonding shelf adjacent said cavity;
   an integrated circuit disposed within said cavity, said integrated circuit including conductive pads;
   bonding pads arranged on said bonding shelf in plural rows including a outer row spaced from said cavity and a inner row located between said outer row and said cavity;

bonding wires for electrically connecting said bonding pads with said conductive pads;

contacts physically connected with said package, said contacts providing for electrical communication with an incorporating system; and conductive paths, each path defining an electrical connection between at least one of said contacts and at least one of said bonding pads, said conductive paths including a first conductive path electrically connecting a first of said bonding pads of said inner row with a first of said contacts, said first conductive path including a conductive first segment disposed upon a second of said layers.

6. The integrated circuit assembly of claim 5 further characterized in that said first conductive path includes a via electrically connecting said first bonding pad with said first segment so that said first conductive path is electrically isolated from all conductive paths of said outer row.

7. The integrated circuit assembly of claim 1 further characterized in that said first conductive path includes a second segment disposed upon said first layer, said first conductive path including a via electrically connecting said first segment with said second segment, said plural layers including a third layer, each conductive path with a pad in said outer row including a proximal segment disposed on said first layer and a distal segment disposed on said third layer, each conductive path with a pad in said outer row having a via electrically connecting the respective proximal segment with the respective distal segment.

* * * * *